US012794199B2

(12) United States Patent
Zhao et al.

(10) Patent No.: US 12,794,199 B2
(45) Date of Patent: Nov. 10, 2026

(54) HETEROGENEOUS INTEGRATED SILICON PHOTONIC SEMICONDUCTOR OPTICAL AMPLIFIER

(71) Applicant: OpenLight Photonics, Inc., Goleta, CA (US)

(72) Inventors: Hongwei Zhao, Goleta, CA (US); Han Yun, Santa Clara, CA (US)

(73) Assignee: OpenLight Photonics, Inc.

( * ) Notice: Subject to any disclaimer, the term of this patent is extended or adjusted under 35 U.S.C. 154(b) by 359 days.

(21) Appl. No.: 18/651,886

(22) Filed: May 1, 2024

(65) Prior Publication Data

US 2025/0343397 A1 Nov. 6, 2025

(51) Int. Cl.
*H01S 5/50* (2006.01)
*H01S 5/02* (2006.01)
*H01S 5/026* (2006.01)

(52) U.S. Cl.
CPC ................ *H01S 5/50* (2013.01); *H01S 5/021* (2013.01); *H01S 5/026* (2013.01)

(58) Field of Classification Search
CPC ............. H01S 5/50; H01S 5/021; H01S 5/026
See application file for complete search history.

(56) References Cited

U.S. PATENT DOCUMENTS

2024/0332907 A1* 10/2024 Komljenovic ....... G02B 6/1228
2024/0418937 A1* 12/2024 Komljenovic ..... G02B 6/12002
2025/0253621 A1* 8/2025 Hiratani .................. H01S 5/021

* cited by examiner

*Primary Examiner* — Dennis P Joseph
(74) *Attorney, Agent, or Firm* — Foley & Lardner LLP

(57) ABSTRACT

A semiconductor optical amplifier having a III-V semiconductor structure above a silicon structure. The III-V semiconductor structure forms a p-i-n junction with a first portion having a first width and a second portion having a wider second width. The silicon structure includes a silicon waveguide optically coupled to the III-V semiconductor structure and having a central silicon rib extending between two wide trenches. The central silicon rib includes a first tapered portion located under the first portion of the III-V semiconductor structure, the first tapered portion decreasing in width as the first tapered portion extends in a longitudinal direction, and a second tapered portion located under the second portion of the III-V semiconductor structure, the second tapered portion increasing in width as the second tapered portion extends in the longitudinal direction.

20 Claims, 9 Drawing Sheets

HETEROGENEOUS INTEGRATED SILICON PHOTONIC SEMICONDUCTOR OPTICAL AMPLIFIER

TECHNICAL FIELD

The present disclosure generally relates to optical devices and more particularly to semiconductor optical amplifiers integrated into silicon photonic platforms.

BACKGROUND

A semiconductor optical amplifier (SOA) can be manufactured from III-V semiconductor materials to provide on-chip optical power amplification for applications such as LIDAR or microwave photonics systems. However, manufacturing photonic platforms from III-V materials is expensive.

BRIEF DESCRIPTION OF THE SEVERAL VIEWS OF THE DRAWINGS

The following description includes discussion of figures having illustrations given by way of example of implementations of embodiments of the disclosure. The drawings should be understood by way of example, and not by way of limitation. As used herein, references to one or more "examples" or "embodiments" are to be understood as describing a particular feature, structure, or characteristic included in at least one implementation of the inventive subject matter, in at least some circumstances. Thus, phrases such as "in one example", "in some examples", "in some embodiments", "in one embodiment" or "in an alternate embodiment" appearing herein describe various embodiments and implementations of the inventive subject matter, and do not necessarily all refer to the same embodiment. However, they are also not necessarily mutually exclusive. To easily identify the discussion of any particular element or act, the most significant digit or digits in a reference number may refer to the figure ("FIG.") number in which that element or act is first introduced.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, structures, and techniques are not necessarily shown in detail.

An SOA manufactured from III-V semiconductor materials can provide high-power on-chip optical amplification, but at the cost of significant manufacturing expense.

Silicon photonics platforms enable high-volume, large-scale manufacturing of photonic integrated circuits at low cost, but silicon does not provide a high-performance gain medium for optical amplification. Thus, there exists a need for high-power SOAs with high saturation power in silicon photonics circuits.

Examples described herein provide a heterogeneous integrated SOA manufactured as a combined III-V and silicon photonics platform, by hybrid integration via heterogeneous bonding. In some examples, the SOA may provide the high optical power amplification of a III-V SOA while realizing one or more of the benefits of silicon photonics platforms, such as scalability and/or low cost of manufacturing.

Existing approaches to integration of III-V semiconductor materials into silicon photonics platforms to form high-power SOAs have tended to result in limited power amplification and/or high levels of noise, and some such approaches require tight process controls that offset the manufacturing advantages of silicon photonics platforms. Examples described herein may address one or more of these technical problems by providing high power amplification, low noise, and/or ease of manufacturing relative to existing approaches.

Figure 1:
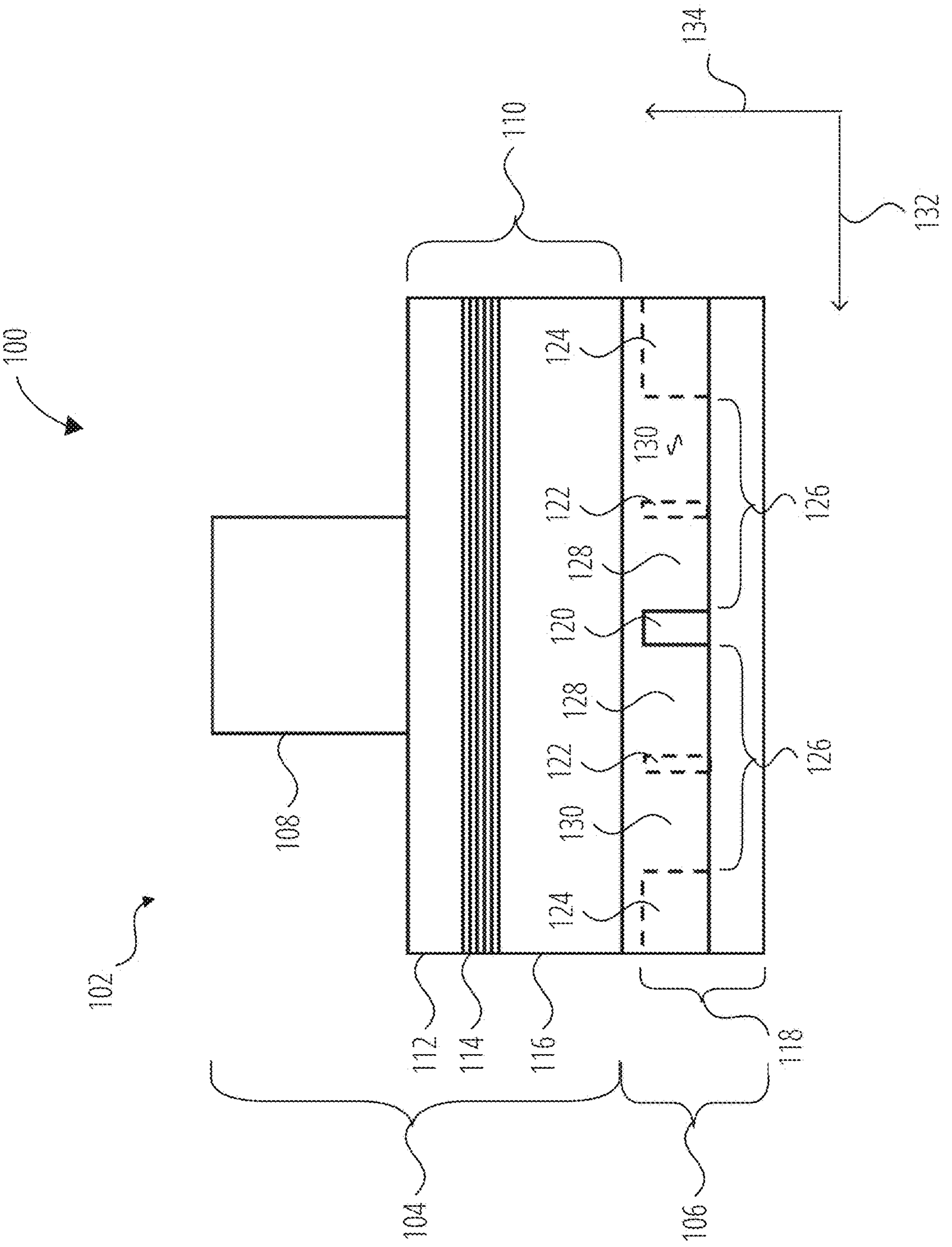
FIG. 1 illustrates a front cross-sectional view of a heterogeneously integrated semiconductor optical amplifier (SOA) showing optional features in dashed lines, in accordance with some examples.

FIG. 1 illustrates a front cross-sectional view of a photonic integrated circuit (PIC 100) incorporating a heterogeneously integrated semiconductor optical amplifier (SOA 102). The front cross-sectional view of FIG. 1 shows several optional features of the SOA 102 in dashed lines.

The SOA 102 includes a III-V semiconductor structure 104 located above a silicon structure 106. The term "III-V semiconductor" refers to compounds formed from elements in the III and V columns of the periodic table, such as gallium arsenide (GaAs) or indium phosphide (InP), which are known for their superior electron mobility and direct bandgap properties, making them highly efficient for optoelectronic applications.

As used herein, directional terms such as "above", "below", "upper", "lower", and other relative vertical positions (or distances, such as "thickness") are intended in this disclosure to refer to the relative positions of various features with respect to a lamination direction 134, along which layers of the PIC 100 may be successively formed during fabrication. Similarly, terms such as "lateral" or "width" may refer to distances or directions defined with respect to a lateral direction 132 orthogonal to the lamination direction 134. Terms such as "length" may refer to distances defined with respect to a longitudinal direction orthogonal to the lamination direction 134 and the lateral direction 132 (the longitudinal direction extends in and out of the plane of the drawing of FIG. 1, which is defined by the lamination direction 134 and lateral direction 132).

The III-V semiconductor structure 104 as shown in cross-section in FIG. 1 forms a III-V ridge waveguide having a ridge 108 above a p-i-n junction 110, the ridge extending in the longitudinal direction 136. The p-i-n junction 110 is a multilayer structure comprising a sequence of differently doped semiconductor layers deposited to form a vertical stack in the lamination direction 134: at least one n-type semiconductor layer 116, at least one intrinsic semiconductor layer 114, and at least one p-type semiconductor layer 112. In some examples, the n-type semiconductor layer 116 is thicker (defined in the lamination direction 134) than the p-type semiconductor layer 112. The n-type layer 116 may be composed of materials such as n-doped InP, and the p-type layer 112 may be composed of materials such as p-doped GaAs, to facilitate certain electrical and optical properties. Metal electrodes, such as metal n-type and p-type electrodes, which are not depicted in FIG. 1, are formed in contact with the n-type layer 116 and the p-type layer 112 to enable electrical connectivity and carrier injection.

The silicon structure 106 includes a silicon waveguide 118 having a central silicon rib 120 extending under the III-V semiconductor structure 104 in the longitudinal direction to form a silicon ridge waveguide. The central silicon rib 120 is designed to be optically coupled to the III-V semiconductor structure 104, ensuring efficient light transfer between the two materials.

Two trenches 126 are defined laterally on either side of the central silicon rib 120. In some examples, the central silicon rib 120 has a width (defined in the lateral direction 132) that varies between a first rib width of at least 1 micrometers (μm) and no more than 3 μm, and second rib width of less than 0.5 μm. The central silicon rib 120 may vary in width as it extends in the longitudinal direction, as described in greater detail below with reference to FIG. 2. In some examples, the trenches 126 each have a constant width, such that the lateral locations of the trenches 126 may change as the central silicon rib 120 changes in width as it extends in the longitudinal direction.

In some examples, the silicon waveguide 118 also includes two supporting silicon ribs 122 extending parallel to at least a portion of the central silicon rib 120 and located such that each supporting silicon rib 122 is laterally separated from the central silicon rib 120 within a respective trench 126. Each supporting silicon rib 122 defines within its respective trench 126 an inner trench 128 proximal to the central silicon rib 120 and an outer trench 130 distal from the central silicon rib 120. Because the supporting silicon ribs 122 extend parallel to the central silicon rib 120, the inner trenches 128 defined by the supporting silicon ribs 122 are also of constant width for at least a portion of their length, the supporting silicon ribs 122 maintaining a constant lateral separation from the central silicon rib 120. In some examples, the supporting silicon ribs 122 each have a width of less than 0.5 μm. Adding the supporting silicon ribs 122 may contribute to the structural integrity of the device, particularly during the bonding process, by mitigating the risk of delamination.

In some examples, the silicon waveguide 118 includes slabs 124 located laterally to either side of the central silicon rib 120 or the supporting silicon rib 122. The slabs 124 define the outer lateral edges of the pair of trenches 126. In examples having supporting silicon ribs 122, the slabs 124 also define the outer lateral edges of the outer trenches 130. In some examples, the outer trenches 130 may have a width that is the same, or nearly the same, as the width of the inner trenches 128. The slabs 124, which may be formed from silicon or a silicon-containing material, may contribute to the structural framework of the silicon waveguide 118.

Using wide trenches 126 (e.g., a width of each trench 126 greater than 3.5 μm) can assist in maintaining the optical mode of light propagating with the SOA 102 to be highly confined within the III-V waveguide, which can reduce excess loss. The location of the optical mode in various example SOAs 102 is described in greater detail below with reference to FIG. 3, FIG. 5, and FIG. 7.

Some existing techniques for improving SOA saturation power on a III-V semiconductor platform may involve increasing the width of the ridge of the waveguide(s) used in the SOA, or reducing the confinement factor by engineered epitaxial design. However, in the context of silicon/III-V semiconductor hybrid platforms, a silicon waveguide layer (e.g., silicon waveguide 118) may by be located underneath the III-V waveguide layer (e.g., III-V semiconductor structure 104) to reduce the optical mode confinement in the III-V waveguide. In some cases, this creates a risk of adding excess loss to the SOA and compromising the output power and saturation power of the SOA. Accordingly, examples described herein may address these limitations by widening the trenches used in the silicon layer (e.g., trenches 126), and/or by adding supporting silicon rib waveguides (e.g., supporting silicon ribs 122) to improve SOA performance. The supporting silicon ribs 122 can provide improved strength to the heterogeneous bonding to compensate for the wide trenches.

Figure 2:
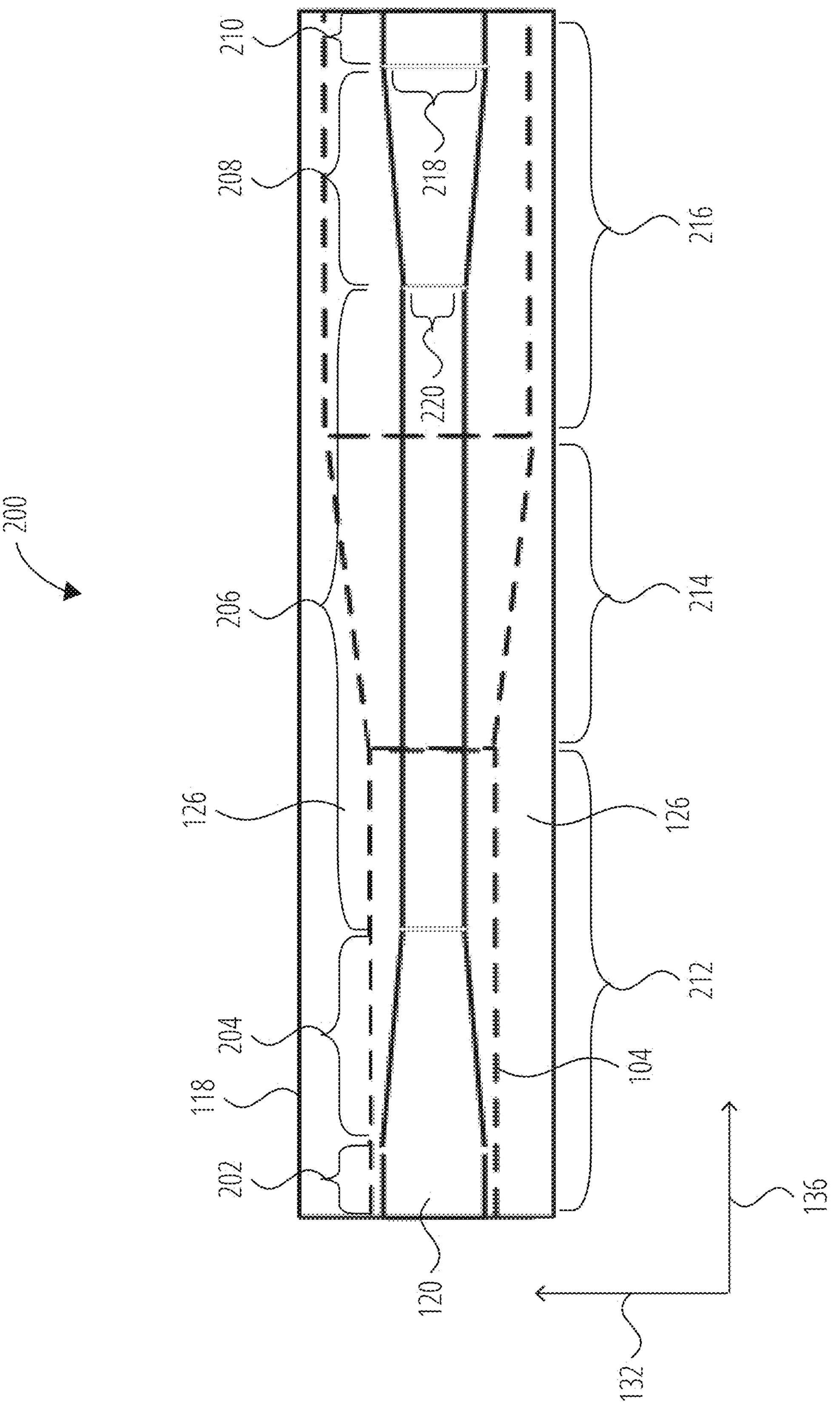
FIG. 2 illustrates a top-down plan view of a single rib silicon waveguide of a first example SOA overlaid with a III-V semiconductor structure shown in dashed lines, in accordance with some examples.

FIG. 2 illustrates a top-down plan view of a single rib silicon waveguide 118 of a first example SOA 200, overlaid with a III-V semiconductor structure 104 shown in dashed lines.

The silicon waveguide 118 of the illustrated first example SOA 200 does not have supporting silicon ribs 122 or slabs 124 located under the III-V semiconductor structure 104. Instead, it has only the central silicon rib 120 extending in the longitudinal direction 136 under the III-V semiconductor structure 104. The central silicon rib 120 is designed to provide light coupling with the III-V semiconductor structure 104, thereby enabling the SOA's amplification capabilities.

The central silicon rib 120 changes in width several times as it extends along the longitudinal direction 136, and the III-V semiconductor structure 104 also changes in width as it extends along the longitudinal direction 136. Beginning at the left side of the drawing and extending in the longitudinal direction 136, the central silicon rib 120 has a first end portion 202, a first tapered portion 204, an intermediate portion 206, a second tapered portion 208, and a second end portion 210. The III-V semiconductor structure 104 has a first portion 212 on the left, a tapered III-V portion 214, and a second portion 216 on the right. The second portion 216 is thus offset from the first portion 212 in the longitudinal direction 136. The intermediate portion 206 of the central silicon rib 120, located between the first tapered portion 204 and the second tapered portion 208, has a constant second rib width 220 defined in the lateral direction 132, and tapered III-V portion 214 of the III-V semiconductor structure 104 is located above the intermediate portion 206. The III-V semiconductor structure increasing in width from the first width to the second width along a length of the tapered III-V portion in the longitudinal direction. In some examples, the SOA 102 extends in the longitudinal direction 136 for a length of greater than or equal to 1 millimeter (mm). The length of the SOA may be selected to provide a balance between the device's physical footprint and the need for sufficient interaction length for effective signal amplification.

The overlap of the silicon waveguide 118 with the III-V semiconductor structure 104 implements two low-loss III-V-silicon waveguide transition couplers on both sides of the device with a central portion that provides high optical gain. The transition couplers, formed by the overlap of the silicon waveguide 118 with the III-V semiconductor structure 104, can be engineered to provide low-loss transitions between the silicon and III-V materials, which assists in maintaining the integrity of the optical signal as it traverses the heterogeneous interface. On the left, the first tapered portion 204 of the silicon waveguide 118 underlies the first portion 212 of the III-V semiconductor structure 104, defining a first waveguide transition coupler. The first tapered portion 204 decreases in width from a first rib width 218 of the first end portion 202 to a second rib width 220 of the intermediate portion 206 (measured along the lateral direction 132) as it extends in the longitudinal direction 136. On the right, the second tapered portion 208 underlies the second portion 216 of the III-V semiconductor structure 104, defining a second waveguide transition coupler. The second tapered portion 208 increases in width from the second rib width 220 of the intermediate portion 206 to the first rib width 218 of the second end portion 210 (measured along the lateral direction 132) as it extends in the longitudinal direction 136. In some examples, the second rib width 220 of the central silicon rib 120 is less than 0.5 μm. In some examples, the first rib width 218 of the central silicon rib 120 is at least 1 μm and no more than 3 μm.

In some examples, the first end portion 202 and the second end portion 210 of the central silicon rib 120 are designed to facilitate the integration of the SOA with other photonic components by providing standardized width dimensions that are compatible with common photonic interconnects. In some examples, the first tapered portion 204 and second tapered portion 208 of the central silicon rib 120 are designed to provide a gradual transition in width, which serves to reduce reflection losses at the interface between different waveguide sections, thereby enhancing the overall efficiency of the SOA. The intermediate portion 206 of the central silicon rib 120, having a constant second rib width 220, may be positioned to align with the tapered III-V portion 214 of the III-V semiconductor structure 104, thereby creating a uniform gain region that for stable and consistent optical amplification. In some examples, the changes in width of the first tapered portion 204 and/or the second tapered portion 208 are linear with respect to the longitudinal direction 136. In some examples, the changes in width of the first tapered portion 204 and/or the second tapered portion 208 are non-linear with respect to the longitudinal direction 136. In some examples, the first tapered portion 204 and/or the second tapered portion 208 extend in the longitudinal direction for a length of at least 50 μm and no more than 400 μm. Examples of tapered portions of the silicon waveguide 118 are described below with reference to FIG. 4, FIG. 6, and FIG. 8.

In the center, the III-V semiconductor structure 104 has a tapered III-V portion 214 positioned over an intermediate portion 206 of the silicon waveguide 118 that has a constant width. The tapered III-V portion 214 increases in width as it extends in the longitudinal direction 136, from a first width (of the first portion 212) to a wider second width (of the second portion 216). In some examples, the first width may be at least 1 μm and no more than 4 μm, and the second width may be at least 4 μm and no more than 10 μm. The tapered III-V portion 214 acts a gain region of the III-V semiconductor structure 104, and may be referred to herein as a high optical gain region. In some examples, the taper of the tapered III-V portion 214 is linear with respect to the longitudinal direction 136. In some examples, the III-V semiconductor structure 104 may include more than one tapered portion, and/or a non-linear increase in width of the III-V semiconductor structure 104 over the tapered III-V portion 214. In some examples, the design of the SOA incorporates considerations for thermal management, with the silicon waveguide 118's material properties and the geometry of the III-V semiconductor structure 104 being designed to ensure efficient heat dissipation during operation.

Thus, in some examples, the silicon waveguide 118 includes at least a central silicon rib 120 extending in the longitudinal direction 136 under the III-V semiconductor structure 104 laterally between two trenches 126. In some examples, each trench 126 has a relatively wide width in the lateral direction, e.g., a width of at least 3.5 μm. The overall width of the trenches 126 may be relatively wide, regardless of whether the trenches 126 include supporting silicon rib 122, as described in reference to FIG. 1 and the third example SOA 700 of FIG. 7 and FIG. 8 below. The trenches 126, with their substantial width, may improve the confinement of the optical mode within the III-V semiconductor structure 104, which may assist in achieving high saturation power without incurring significant optical losses.

Figure 3:
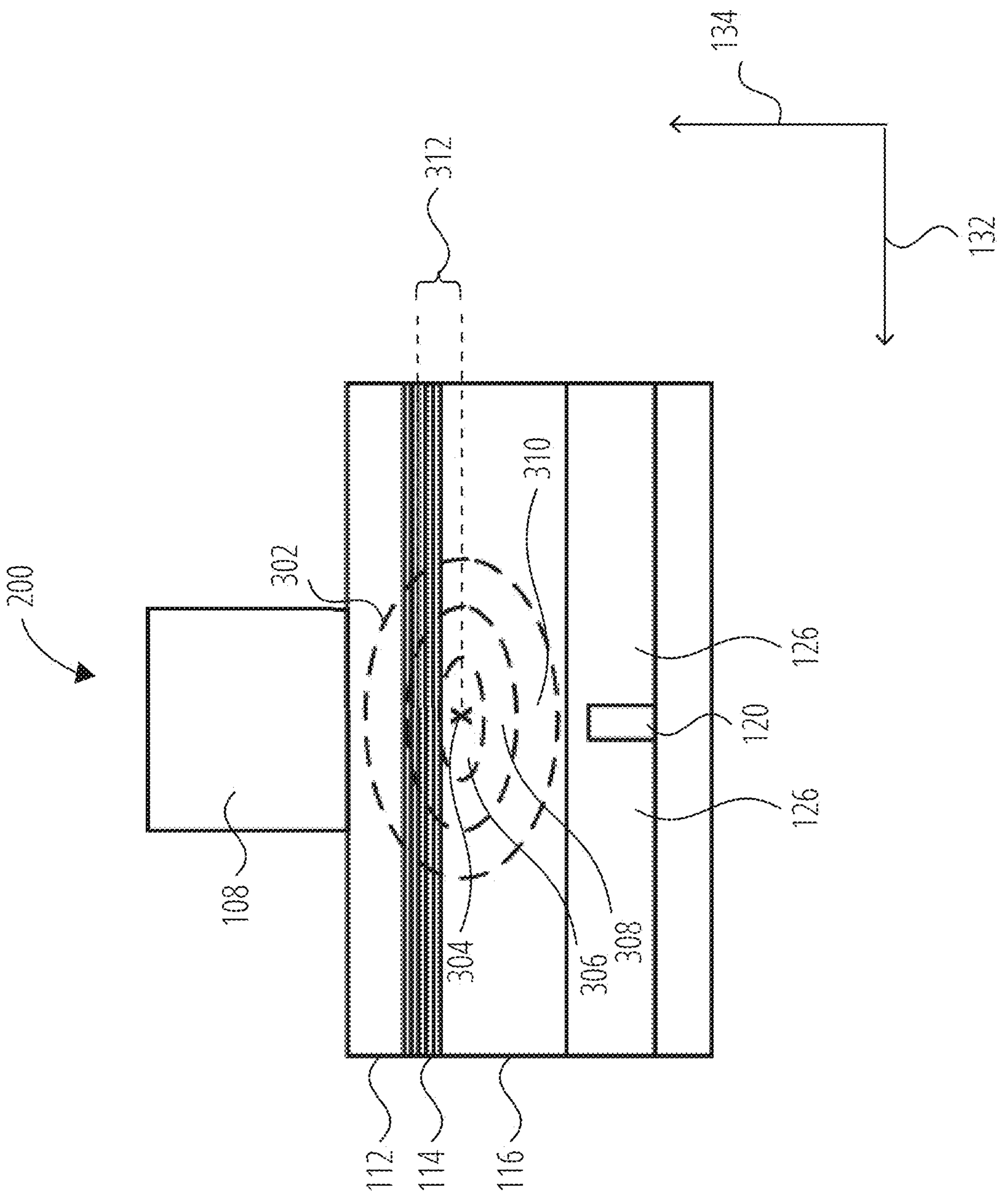
FIG. 3 illustrates a front cross-sectional view of the first example heterogeneously integrated SOA of FIG. 2, showing the location of the optical mode, in accordance with some examples.

FIG. 3 illustrates a front cross-sectional view of the first example SOA 200 heterogeneously integrated into the PIC, showing the location of an optical mode 302. The optical mode 302 may be the fundamental mode (e.g., the transverse electric $TE_{00}$ mode) or another mode of light propagating within the III-V semiconductor structure 104. Whereas the first example SOA 200 can support a single mode or multiple modes, higher order modes may experience high propagation loss or lower gain relative to the fundamental mode.

The optical mode 302 of light propagating in the first example SOA 200 has a center 304, around which are successively defined a central region 306, an intermediate region 308, and an outer region 310. The delineation of the optical mode 302 into a central region 306, an intermediate region 308, and an outer region 310 is indicative of the mode's intensity profile, with the highest intensity at the center 304 and gradually decreasing towards the outer region 310.

The intrinsic semiconductor layer 114 may include one or more quantum wells, such as one or more quantum well layers. The quantum wells within the intrinsic semiconductor layer 114 are designed to have specific bandgap energies that align with the wavelength of the light propagating through the SOA 200, thereby optimizing the interaction between the light and the active medium for efficient amplification. The first example SOA 200 is configured such that the optical mode of light propagating within the III-V semiconductor structure 104 has an optical mode 302 whose center 304 is displaced vertically (in the lamination direction 134) from a quantum well of the intrinsic semiconductor layer 114 by a vertical offset 312. In some examples, the center 304 of the optical mode 302 has a vertical offset 312 of at least 50 nanometers (nm) and no more than 500 nm from a vertical center of the intrinsic semiconductor layer 114. In some examples, the vertical offset 312 of the center 304 of the optical mode 302 from the center or vertical midpoint of the quantum well(s) can be precisely controlled during epitaxial growth process of the III-V semiconductor layers to achieve desired saturation power characteristics.

Offsetting the quantum wells from the center of the optical mode can result in lower confinement within the intrinsic semiconductor layer 114, which can increase the saturation power of the SOA. In some examples, the n-type semiconductor layer 116 has a greater thickness (defined in the lamination direction 134) than the p-type semiconductor layer 112, and this asymmetry can further improve confinement of the optical mode 302 of the light within the III-V semiconductor structure 104 while reducing confinement of the light within the intrinsic semiconductor layer. In some cases, the asymmetrical thickness of the n-type semiconductor layer 116 and the p-type semiconductor layer 112 not only influences the confinement of the optical mode 302 but also affects the electrical field distribution within the SOA 200, which can be optimized for efficient carrier injection and recombination. In some examples, the design of the III-V semiconductor structure 104, including specific layer thicknesses and material compositions, ca be based on computational modeling to ensure that the optical mode 302 is effectively confined within the high-gain region while minimizing losses to the surrounding material. 114.

Figure 4:
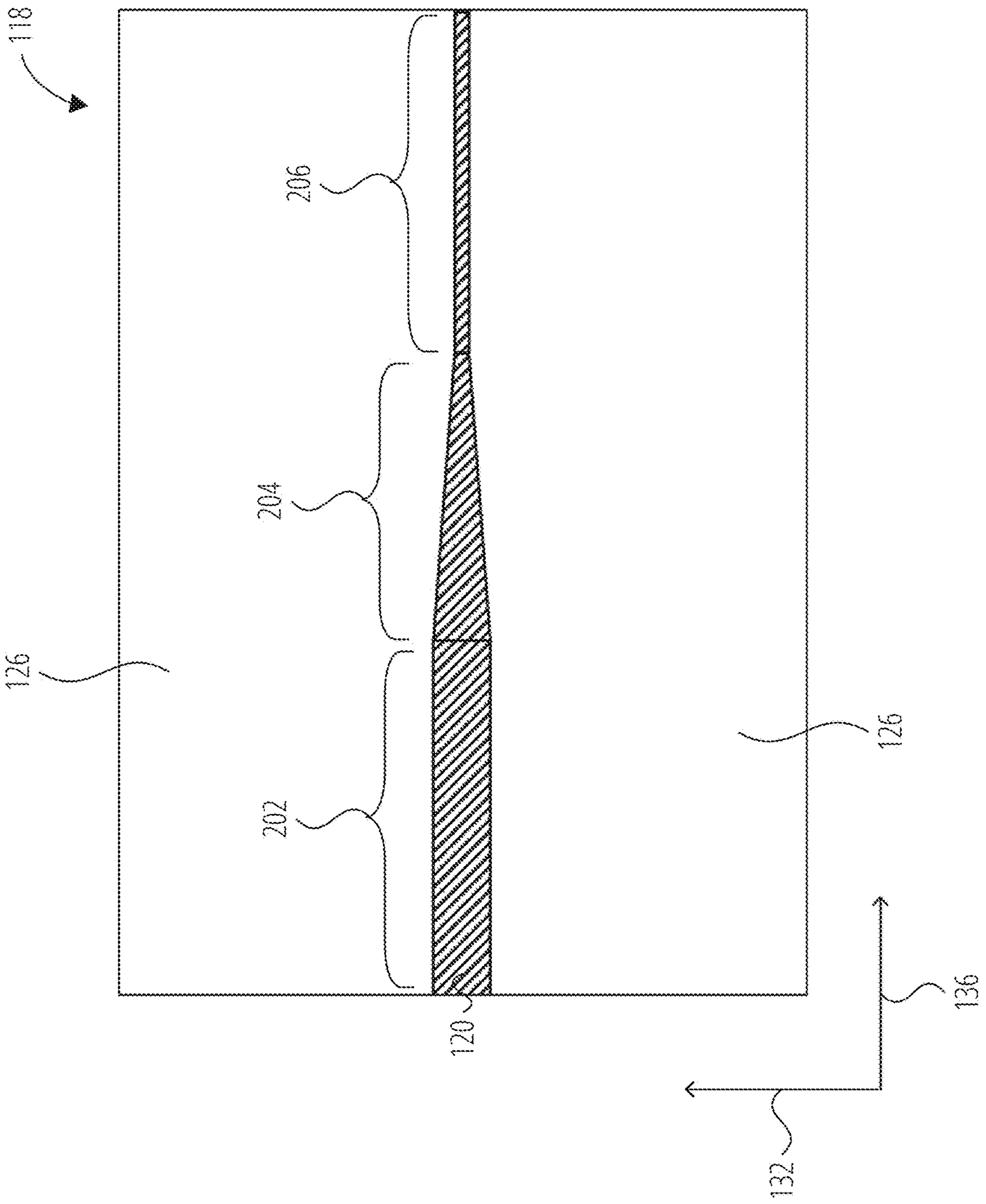
FIG. 4 illustrates a top-down plan view of the single rib waveguide of the first example SOA of FIG. 2, in accordance with some examples.

FIG. 4 illustrates a top-down plan view of a portion of the length of the silicon waveguide 118 of the first example SOA 200 (corresponding to the left end of the first example SOA 200 as shown in FIG. 2). In this example, the first end portion 202, the first tapered portion 204, and a portion of the intermediate portion 206 are shown. The silicon waveguide 118 has very wide trenches 126, which in some examples extend wider (along the lateral direction 132) than the width of the III-V semiconductor structure 104.

It will be appreciated that the right end of the first example SOA 200 as shown in FIG. 2 may be configured as a mirror image of the portion shown in FIG. 3.

Figure 5:
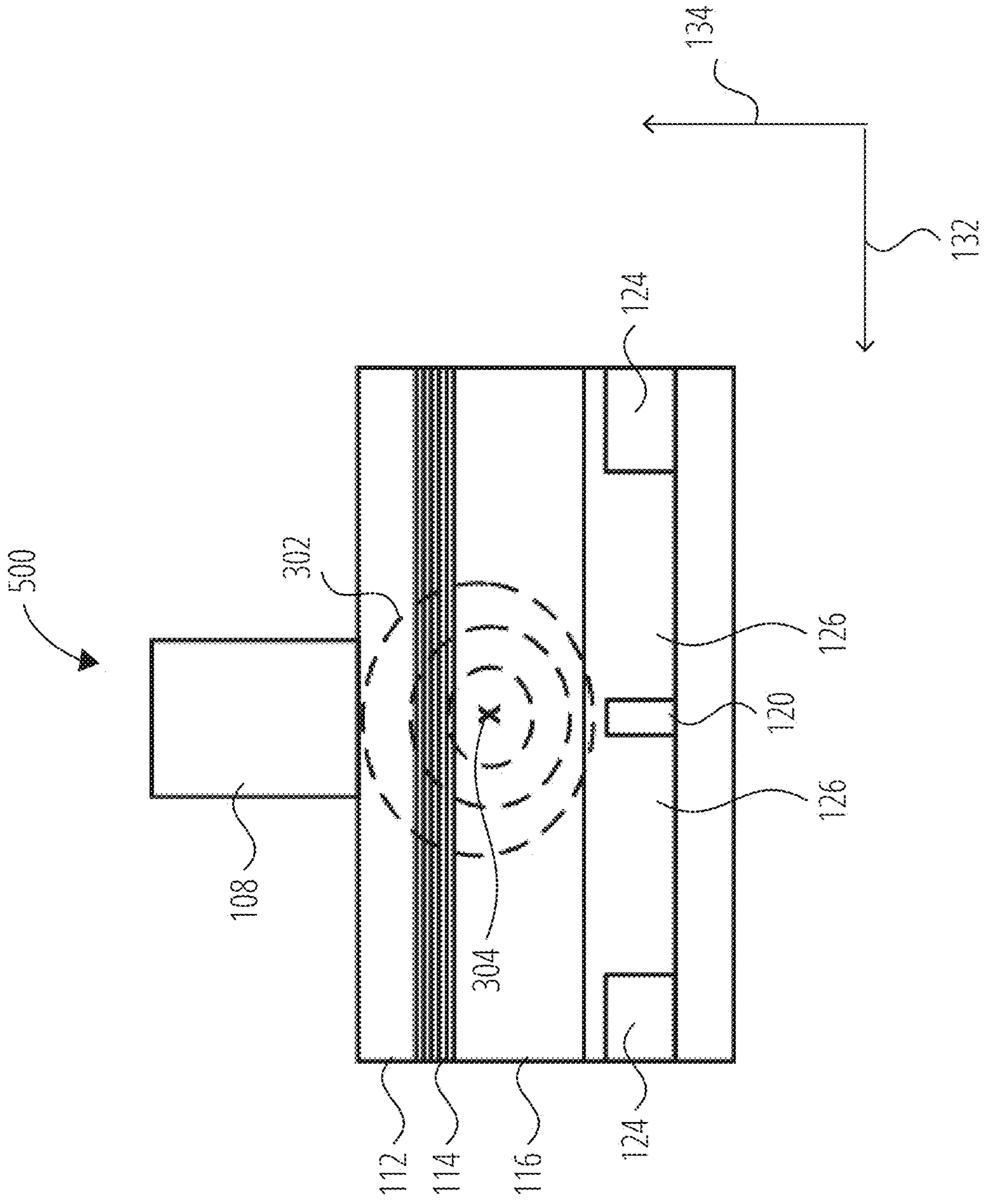
FIG. 5 illustrates a front cross-sectional view of a second example heterogeneously integrated SOA having a single rib silicon waveguide separated from two silicon slabs by trenches, showing the location of the optical mode, in accordance with some examples.

FIG. 5 illustrates a front cross-sectional view of a second example SOA 500 having a single rib silicon waveguide 118 having a central silicon rib 120 separated from two silicon slabs 124 by trenches 126, showing the location of the optical mode 302.

As in FIG. 3, the optical mode 302 of light propagating in the second example SOA 500 has a center 304, around which are successively defined a central region 306, an intermediate region 308, and an outer region 310 (unlabeled).

As in the first example SOA 200 shown in FIG. 3, the intrinsic semiconductor layer 114 of the second example SOA 500 also includes one or more quantum wells, and the second example SOA 500 is configured such that the optical mode of light propagating within the III-V semiconductor structure 104 has an optical mode 302 whose center 304 is displaced vertically from a quantum well of the intrinsic semiconductor layer 114 by a vertical offset, e.g., a vertical offset of at least 50 nanometers (nm) and no more than 500 nm.

In some examples, the trenches 126 have a width that is at least 3.5 μm but less than the width of the III-V semiconductor structure 104, such that, over an entire length of the slabs 124 defined in the longitudinal direction 136, each slab 124 at least partially overlaps with the III-V semiconductor structure 104 with respect to the lamination direction 134.

It will be appreciated that the inclusion of the slabs 124 may alter the shape and distribution of the light of the optical mode 302, while preserving confinement of the light within the III-V semiconductor structure 104 and reducing confinement of the light within the intrinsic semiconductor layer 114.

Figure 6:
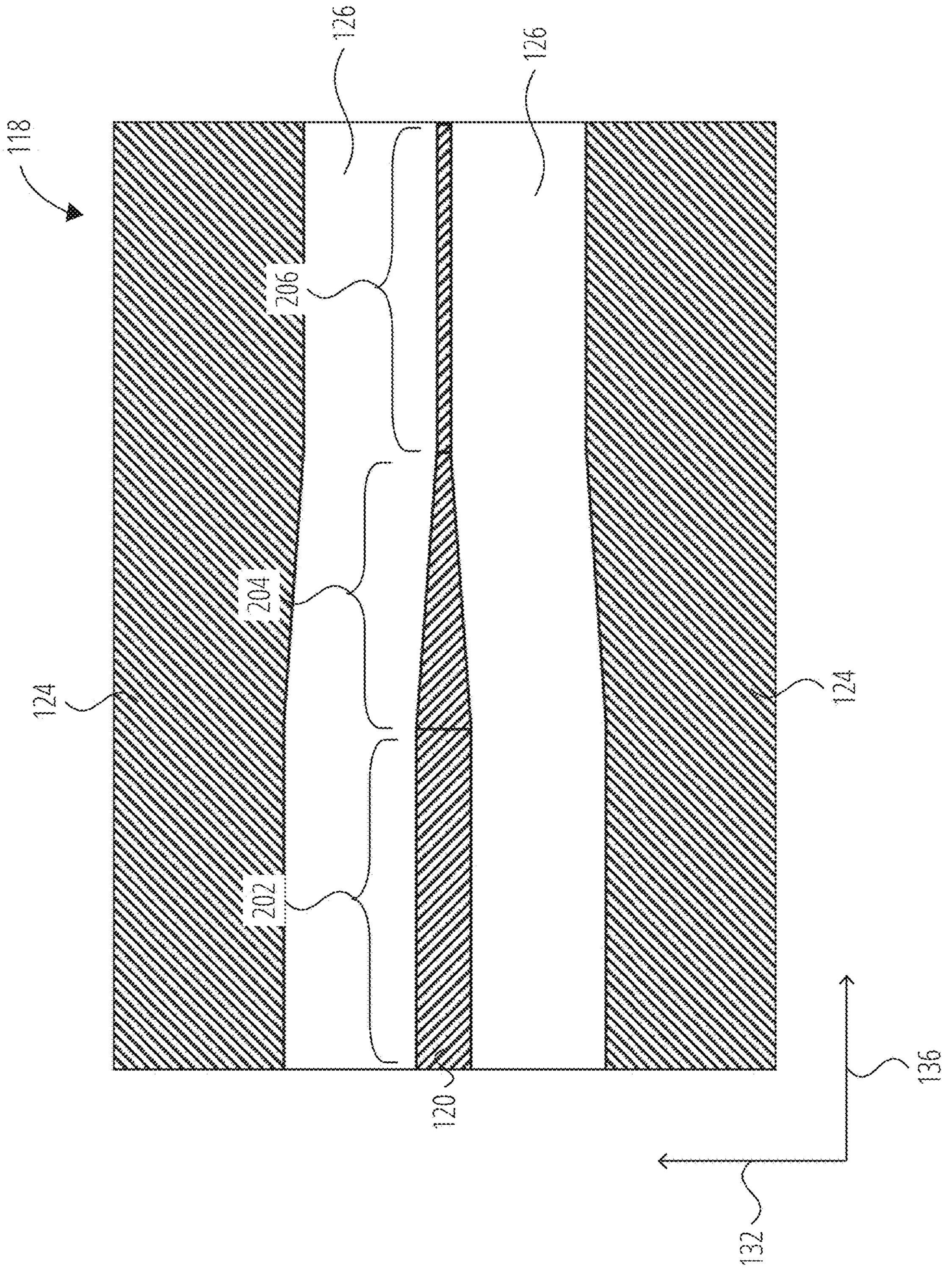
FIG. 6 illustrates a top-down plan view of the single rib silicon waveguide of the second example SOA of FIG. 5, in accordance with some examples.

FIG. 6 illustrates a top-down plan view of the second example SOA 500 shown in cross-section in FIG. 5. The slabs 124 are shown defining trenches 126 that have a constant width in the lateral direction 132, even as the width of the central silicon rib 120 changes. Each trench 126 is thus defined between the central silicon rib 120 and a respective slab 124.

In this example, each slab at least partially overlaps with the III-V semiconductor structure 104 with respect to the lamination direction 134, for the entire length of the slab 124 defined in the longitudinal direction 136.

The slabs 124 may be formed from silicon, a silicon-containing material, or another dielectric material.

Figure 7:
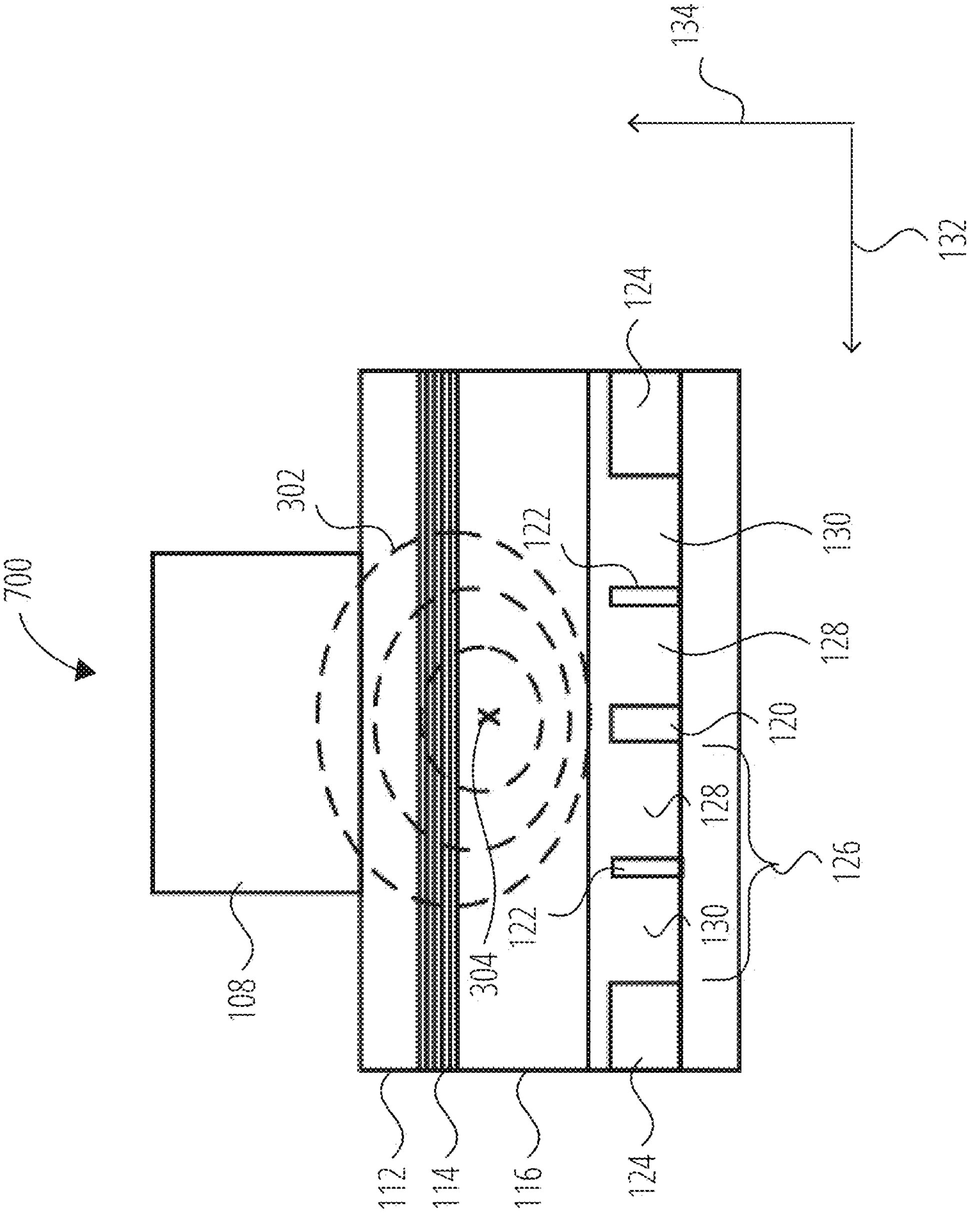
FIG. 7 illustrates a front cross-sectional view of a third example heterogeneously integrated SOA having a three-rib silicon waveguide, showing the location of the optical mode, in accordance with some examples.

FIG. 7 illustrates a front cross-sectional view of a third example SOA 700 having a three-rib silicon waveguide, showing the location of the optical mode 302.

The third example SOA 700 has two supporting silicon ribs 122 in addition to the central silicon rib 120, thereby defining a pair of inner trenches 128 and a pair of outer trenches 130 within the trenches 126. In some examples, the supporting silicon ribs 122 are located midway laterally within the trenches 126, such that the width of the inner trenches 128 is equal to the width of the outer trenches 130. In some examples, the width of the inner trenches 128 and outer trenches 130 is less than 3.5 μm. In some examples, the inner trenches 128 and/or outer trenches 130 have constant widths.

As in FIG. 3 and FIG. 5, the optical mode 302 of light propagating in the second example SOA 500 has a center 304, around which are successively defined a central region 306, an intermediate region 308, and an outer region 310 (unlabeled). The intrinsic semiconductor layer 114 of the second example SOA 500 also includes one or more quantum wells, and the second example SOA 500 is configured such that the optical mode of light propagating within the III-V semiconductor structure 104 has an optical mode 302 whose center 304 is displaced vertically from a quantum well of the intrinsic semiconductor layer 114 by a vertical offset, e.g., a vertical offset of at least 50 nanometers (nm) and no more than 500 nm.

As described above, the use of supporting silicon ribs 122 may allow the use of relatively wide trenches 126 while preventing bonding failure by providing a supporting structure partway along the widths of the trenches.

Figure 8:
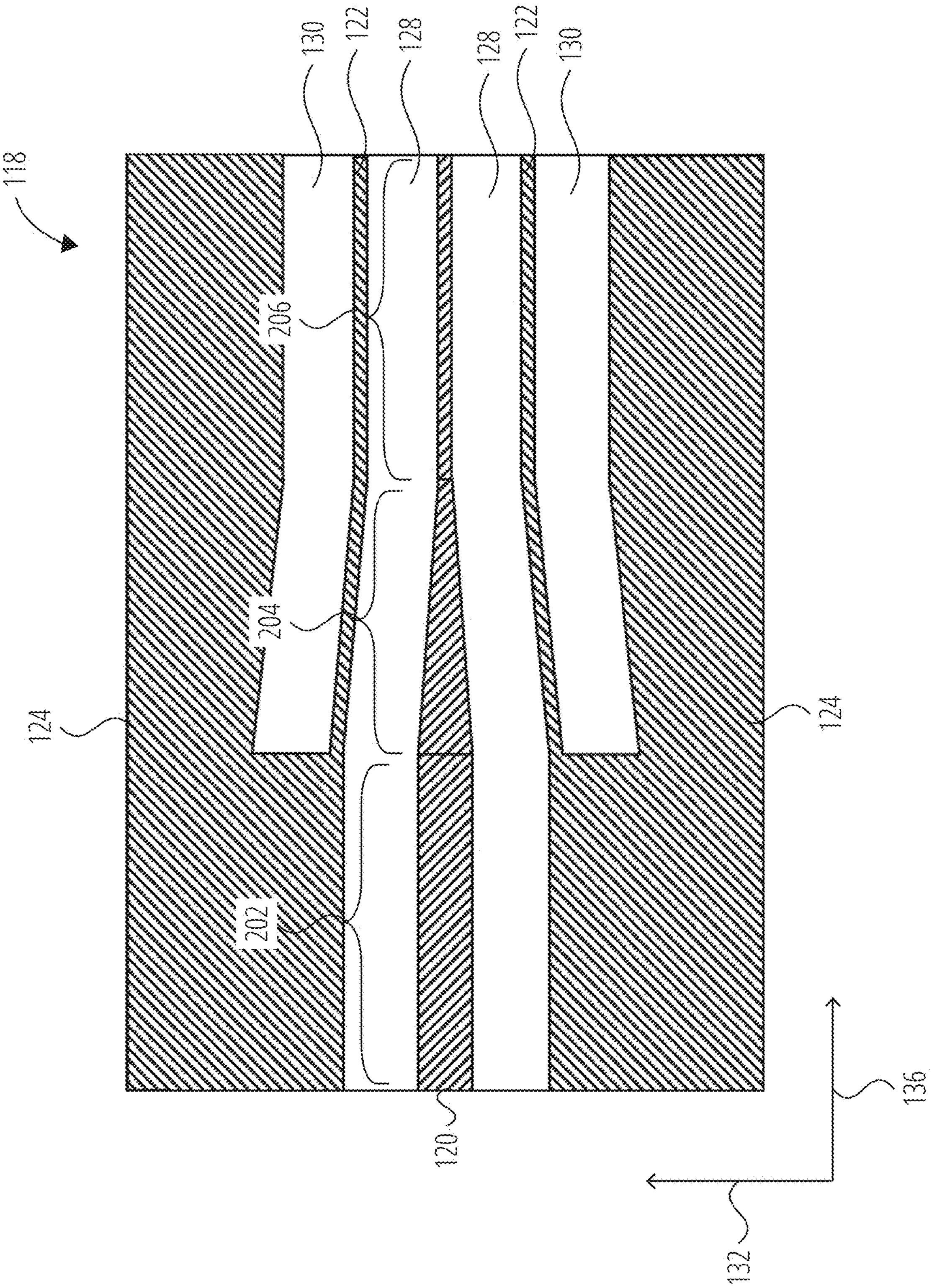
FIG. 8 illustrates a top-down plan view of the three-rib silicon waveguide of the third example SOA of FIG. 7, in accordance with some examples.

FIG. 8 illustrates a top-down plan view of the third example SOA 700 shown in cross-section in FIG. 7. The slabs 124 and supporting silicon ribs 122 are shown defining inner trenches 128 and outer trenches 130 that each have a constant width in the lateral direction 132, even as the width of the central silicon rib 120 changes. This means that the two supporting silicon ribs 122 extend parallel to at least a portion of the central silicon rib, in this example the first tapered portion 204 and intermediate portion 206 but not the first end portion 202 of the central silicon rib 120.

In some examples, each supporting silicon rib 122 has a width defined in the lateral direction 132 of less than 0.5 μm.

In some examples, the width of each supporting silicon rib 122 is equal to the second rib width 220 of the central silicon rib 120.

In this example, the supporting silicon ribs 122 (and therefore also the outer trenches 130) only extend for a portion of the length of the central silicon rib 120 in the longitudinal direction 136. The supporting silicon ribs 122 merge with the slabs 124 for the length of the first end portion 202 shown in FIG. 8 (and, thus, also for the length of the second end portion 210 on the opposite end of the SOA 102). However, it will be appreciated that, in some examples, the supporting silicon ribs 122 (and outer trenches 130) may extend for the full length of the central silicon rib 120.

In this example, each slab at least partially overlaps with the III-V semiconductor structure 104 with respect to the lamination direction 134, for the entire length of the slab 124 defined in the longitudinal direction 136.

Figure 9:
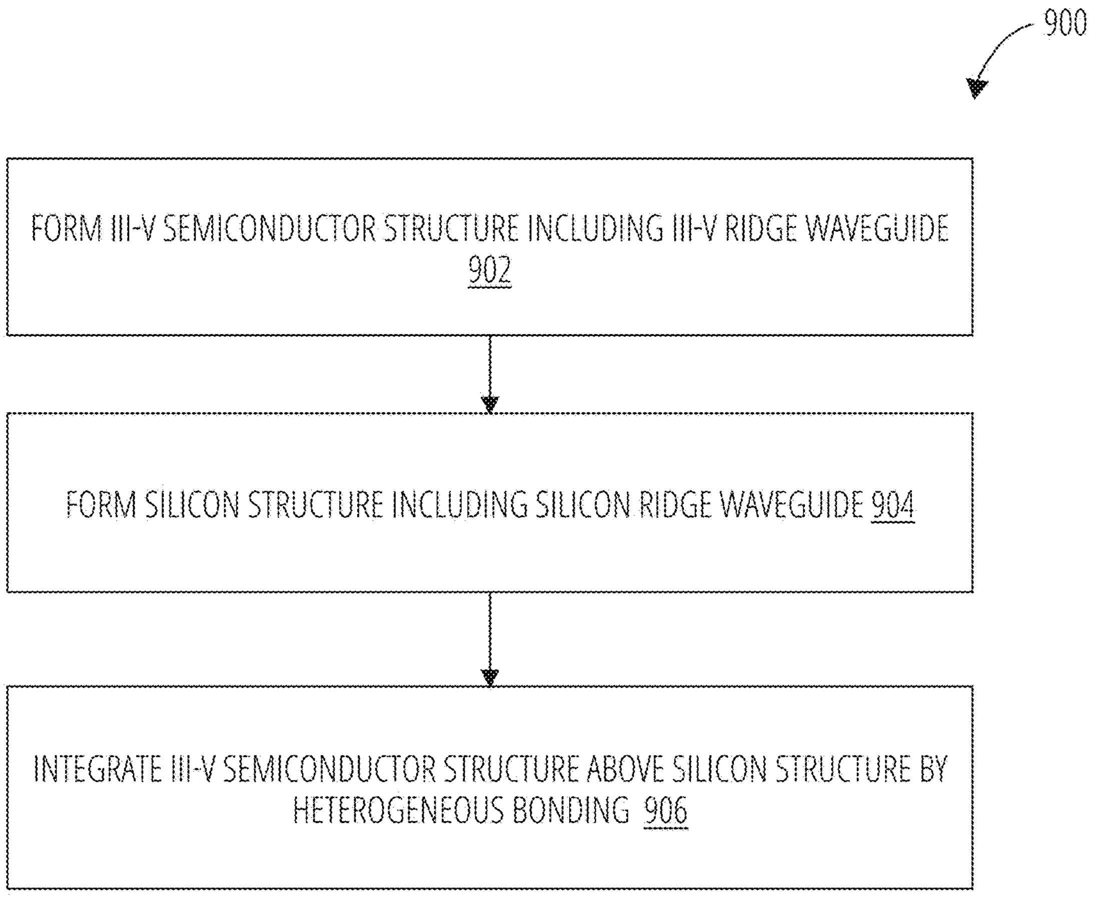
FIG. 9 illustrates a flowchart showing operations of a method of manufacturing a heterogeneously integrated SOA, in accordance with some examples.

FIG. 9 illustrates a flowchart showing operations of a method 900 of manufacturing a heterogeneously integrated SOA, such as SOA 102, first example SOA 200, second example SOA 500, or third example SOA 700. In some examples, the method 900 can be designed to ensure precise alignment between the III-V semiconductor structure 104 and the silicon structure 106, in order to ensure the optimal performance of the SOA.

Although the example method 900 depicts a particular sequence of operations, the sequence may be altered without departing from the scope of the present disclosure. For example, some of the operations depicted may be performed in parallel or in a different sequence that does not materially affect the function of the method 900. In other examples, different components of an example device or system that implements the method 900 may perform functions at substantially the same time or in a specific sequence. The flexibility in the sequence of operations allows for adaptation to various manufacturing constraints and optimization for throughput and yield in a production environment.

According to some examples, the method 900 includes forming the III-V semiconductor structure 104, including the III-V ridge waveguide (e.g., ridge 108 and p-i-n junction 110), at operation 902. The III-V semiconductor structure 104 can be formed using any suitable technique, such as epitaxial growth or deposition of the n-type semiconductor layer 116, intrinsic semiconductor layer 114, p-type semiconductor layer 112, and ridge 108, sequentially, on a growth substrate. As described above, the vertical offset 312 of the center 304 of the optical mode 302 from the quantum well(s) can be precisely controlled during epitaxial growth process of the III-V semiconductor layers to achieve desired saturation power characteristics. During the formation of the III-V semiconductor structure 104, the epitaxial growth process may include monitoring and adjusting the temperature and gas flow rates to achieve the desired layer thicknesses and doping concentrations. The III-V semiconductor structure 104 can then be removed from the substrate for integration at operation 906 below.

According to some examples, the method 900 includes forming the silicon structure 106, including the silicon ridge waveguide (e.g., silicon waveguide 118), at operation 904. The silicon structure 106 can be formed using suitable silicon manufacturing techniques, such as layer formation using photolithography and etching, and deposition and/or bonding to join adjacent layers. The formation of the silicon structure 106 may involve the use of high-resolution lithography techniques to define the waveguide patterns with high (e.g., nanometer-scale) precision. The central silicon rib 120 and/or supporting silicon rib 122 may be formed by etching the trenches 126 (and/or inner trenches 128 and outer trenches 130) and filling the trenches 126 with a trench material. Example materials for filling the trenches 126 during the formation of the silicon structure 106 may include silicon dioxide, polymer-based dielectrics, various oxides, various nitrides, or various other dielectric materials, which can be selected for their compatibility with the silicon substrate and their ability to provide the necessary mechanical support.

According to some examples, the method 900 includes integrating the III-V semiconductor structure 104 above the silicon structure 106 by heterogeneous bonding at operation 906. Hybrid or heterogeneous bonding techniques can be used to integrate the III-V semiconductor structure 104 and silicon structure 106 into the PIC 100 to form the SOA. The heterogeneous bonding process may utilize surface activation techniques to increase the bonding energy between the III-V semiconductor structure 104 and the silicon structure 106, ensuring a robust and reliable integration.

Other examples of such a PIC or SOA, or method for the manufacture thereof, may include features, and combinations or subcombinations of features, of the various examples described herein. Other technical features may be readily apparent to one skilled in the art from the figures, descriptions, and claims herein.

In view of the disclosure above, various examples are set forth below. It should be noted that one or more features of an example, taken in isolation or combination, should be considered within the disclosure of this application.

The following are example embodiments:

Example 1 is a semiconductor optical amplifier (SOA) comprising: a III-V semiconductor structure comprising a p-type semiconductor layer, an intrinsic semiconductor layer, and an n-type semiconductor layer stacked in a lamination direction to form a p-i-n junction, the III-V semiconductor structure comprising: a first portion having a first width defined in a lateral direction orthogonal to the lamination direction; and a second portion, offset from the first portion in a longitudinal direction orthogonal to the lamination direction and the lateral direction, the second portion having a second width as defined in the lateral direction that is wider than the first width; and a silicon structure positioned below the III-V semiconductor structure in the lamination direction, the silicon structure comprising a silicon waveguide optically coupled to the III-V semiconductor structure, the silicon waveguide comprising a central silicon rib extending in the longitudinal direction under the III-V semiconductor structure laterally between two trenches, each trench having a width in the lateral direction of at least 3.5 μm, the central silicon rib comprising: a first tapered portion located under the first portion of the III-V semiconductor structure, the first tapered portion decreasing from a first rib width to a second rib width defined in the lateral direction as the first tapered portion extends in the longitudinal direction; and a second tapered portion located under the second portion of the III-V semiconductor structure, the second tapered portion increasing in width from the second rib width to the first rib width defined in the lateral direction as the second tapered portion extends in the longitudinal direction.

In Example 2, the subject matter of Example 1 includes, wherein: the first width is at least 1 micrometer (μm) and no more than 4 μm; and the second width is at least 4 μm and no more than 10 μm.

In Example 3, the subject matter of Examples 1-2 includes, wherein changes in width of the first tapered portion and second tapered portion are non-linear with respect to the longitudinal direction.

In Example 4, the subject matter of Examples 1-3 includes, wherein changes in width of the first tapered portion and second tapered portion are linear with respect to the longitudinal direction.

In Example 5, the subject matter of Examples 1-4 includes, wherein: the first tapered portion and second tapered portion each extend in the longitudinal direction for a length of at least 50 micrometers (μm) and no more than 400 μm.

In Example 6, the subject matter of Examples 1-5 includes, wherein: the SOA extends in the longitudinal direction for a length of greater than or equal to 1 millimeter (mm).

In Example 7, the subject matter of Examples 1-6 includes, wherein: the second rib width of the central silicon rib is less than 0.5 micrometers (μm).

In Example 8, the subject matter of Example 7 includes, wherein: the first rib width of the central silicon rib is at least 1 μm and no more than 3 μm.

In Example 9, the subject matter of Examples 1-8 includes, wherein: the central silicon rib comprises an intermediate portion between the first tapered portion and the second tapered portion, the intermediate portion having a constant width defined in the lateral direction; and the III-V semiconductor structure comprises a tapered III-V portion located above the intermediate portion, the III-V semiconductor structure increasing in width from the first width to the second width along a length of the tapered III-V portion in the longitudinal direction.

In Example 10, the subject matter of Examples 1-9 includes, wherein: each trench has a constant width.

In Example 11, the subject matter of Examples 1-10 includes, wherein: the silicon structure further comprises two slabs comprising silicon, each trench being defined between the central silicon rib and a respective slab, each slab at least partially with the III-V semiconductor structure with respect to the lamination direction over an entire length of the slab defined in the longitudinal direction.

In Example 12, the subject matter of Examples 1-11 includes, wherein: the silicon structure further comprises two supporting silicon ribs extending parallel to at least a portion of the central silicon rib, each supporting silicon rib being laterally separated from the central silicon rib within a respective trench such that the supporting silicon rib defines within the trench an inner trench proximal to the central silicon rib and an outer trench distal from the central silicon rib.

In Example 13, the subject matter of Example 12 includes, wherein: each supporting silicon rib has a width defined in the lateral direction of less than 0.5 micrometers (μm).

In Example 14, the subject matter of Examples 1-13 includes, wherein: the intrinsic semiconductor layer comprises one or more quantum wells.

In Example 15, the subject matter of Example 14 includes, wherein: the intrinsic semiconductor layer is offset in the lamination direction from a center of an optical mode of the SOA by at least 50 nanometers (nm) and no more than 500 nm.

In Example 16, the subject matter of Examples 1-15 includes, wherein: the n-type semiconductor layer has a thickness defined in the lamination direction that is greater than a thickness of the p-type semiconductor layer defined in the lamination direction.

In Example 17, the subject matter of Examples 1-16 includes, wherein: the III-V semiconductor structure comprises a ridge waveguide having a ridge extending in the longitudinal direction.

Example 18 is a method of forming a semiconductor optical amplifier (SOA), the method comprising: forming a III-V semiconductor structure by sequentially depositing an n-type semiconductor layer, an intrinsic semiconductor layer, and a p-type semiconductor layer to form a p-i-n junction stacked in a lamination direction, forming a silicon structure comprising a silicon waveguide, the silicon waveguide comprising a central silicon rib extending in a longitudinal direction between two trenches, each trench having a width defined in a lateral direction of at least 3.5 μm; and integrating the III-V semiconductor structure above the silicon structure in the lamination direction by heterogeneous bonding such that: the silicon waveguide is under the III-V semiconductor structure; the silicon waveguide is optically coupled to the III-V semiconductor structure by two waveguide transition couplers defined by the central silicon rib, the two waveguide transition couplers being displaced from each other in the longitudinal direction; and the III-V semiconductor structure defines a high optical gain region, in between the two waveguide transition couplers with respect to the longitudinal direction.

Example 19 is a photonic integrated circuit (PIC) comprising a semiconductor optical amplifier (SOA), the SOA comprising: a III-V semiconductor structure comprising a p-type semiconductor layer, an intrinsic semiconductor layer, and an n-type semiconductor layer stacked in a lamination direction to form a p-i-n junction, the III-V semiconductor structure having: a first portion having a first width defined in a lateral direction orthogonal to the lamination direction; and a second portion, offset from the first portion in a longitudinal direction orthogonal to the lamination direction and the lateral direction, the second portion having a second width as defined in the lateral direction that is wider than the first width; and a silicon structure positioned below the III-V semiconductor structure in the lamination direction, the silicon structure comprising a silicon waveguide optically coupled to the III-V semiconductor structure, the silicon waveguide comprising a central silicon rib extending in the longitudinal direction under the III-V semiconductor structure laterally between two trenches, each trench having a width in the lateral direction of at least 3.5 μm, the central silicon rib comprising: a first tapered portion located under the first portion of the III-V semiconductor structure, the first tapered portion increasing in width defined in the lateral direction as the first tapered portion extends in the longitudinal direction; and a second tapered portion located under the second portion of the III-V semiconductor structure, the second tapered portion decreasing in width defined in the lateral direction as the second tapered portion extends in the longitudinal direction, the silicon structure and the III-V semiconductor structure being heterogeneously integrated into the PIC.

In Example 20, the subject matter of Example 19 includes, wherein: the silicon structure further comprises two supporting silicon ribs extending parallel to at least a portion of the central silicon rib, each supporting silicon rib being laterally separated from the central silicon rib within a respective trench such that the supporting silicon rib defines within the trench an inner trench proximal to the central silicon rib and an outer trench distal from the central silicon rib.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

What is claimed is:

1. A semiconductor optical amplifier (SOA) comprising:
a III-V semiconductor structure comprising a p-type semiconductor layer, an intrinsic semiconductor layer, and an n-type semiconductor layer stacked in a lamination direction to form a p-i-n junction, the III-V semiconductor structure comprising:
a first portion having a first width defined in a lateral direction orthogonal to the lamination direction; and
a second portion, offset from the first portion in a longitudinal direction orthogonal to the lamination direction and the lateral direction, the second portion having a second width as defined in the lateral direction that is wider than the first width; and
a silicon structure positioned below the III-V semiconductor structure in the lamination direction, the silicon structure comprising a silicon waveguide optically coupled to the III-V semiconductor structure, the silicon waveguide comprising a central silicon rib extending in the longitudinal direction under the III-V semiconductor structure laterally between two trenches, each trench having a width in the lateral direction of at least 3.5 μm, the central silicon rib comprising:
a first tapered portion located under the first portion of the III-V semiconductor structure, the first tapered portion decreasing from a first rib width to a second rib width defined in the lateral direction as the first tapered portion extends in the longitudinal direction; and
a second tapered portion located under the second portion of the III-V semiconductor structure, the second tapered portion increasing in width from the second rib width to the first rib width defined in the lateral direction as the second tapered portion extends in the longitudinal direction.

2. The SOA of claim 1, wherein:
the first width is at least 1 micrometer (μm) and no more than 4 μm; and
the second width is at least 4 μm and no more than 10 μm.

3. The SOA of claim 1, wherein changes in width of the first tapered portion and second tapered portion are non-linear with respect to the longitudinal direction.

4. The SOA of claim 1, wherein changes in width of the first tapered portion and second tapered portion are linear with respect to the longitudinal direction.

5. The SOA of claim 1, wherein:
the first tapered portion and second tapered portion each extend in the longitudinal direction for a length of at least 50 micrometers (μm) and no more than 400 μm.

6. The SOA of claim 1, wherein:
the SOA extends in the longitudinal direction for a length of greater than or equal to 1 millimeter (mm).

7. The SOA of claim 1, wherein:
the second rib width of the central silicon rib is less than 0.5 micrometers (μm).

8. The SOA of claim 7, wherein:
the first rib width of the central silicon rib is at least 1 μm and no more than 3 μm.

9. The SOA of claim 1, wherein:
the central silicon rib comprises an intermediate portion between the first tapered portion and the second tapered portion, the intermediate portion having a constant width defined in the lateral direction; and
the III-V semiconductor structure comprises a tapered III-V portion located above the intermediate portion, the III-V semiconductor structure increasing in width from the first width to the second width along a length of the tapered III-V portion in the longitudinal direction.

10. The SOA of claim 1, wherein:
each trench has a constant width.

11. The SOA of claim 1, wherein:
the silicon structure further comprises two slabs comprising silicon, each trench being defined between the central silicon rib and a respective slab, each slab at least partially with the III-V semiconductor structure with respect to the lamination direction over an entire length of the slab defined in the longitudinal direction.

12. The SOA of claim 1, wherein:
the silicon structure further comprises two supporting silicon ribs extending parallel to at least a portion of the central silicon rib, each supporting silicon rib being laterally separated from the central silicon rib within a respective trench such that the supporting silicon rib defines within the trench an inner trench proximal to the central silicon rib and an outer trench distal from the central silicon rib.

13. The SOA of claim 12, wherein:
each supporting silicon rib has a width defined in the lateral direction of less than 0.5 micrometers (μm).

14. The SOA of claim 1, wherein:
the intrinsic semiconductor layer comprises one or more quantum wells.

15. The SOA of claim 14, wherein:
the intrinsic semiconductor layer is offset in the lamination direction from a center of an optical mode of the SOA by at least 50 nanometers (nm) and no more than 500 nm.

16. The SOA of claim 1, wherein:
the n-type semiconductor layer has a thickness defined in the lamination direction that is greater than a thickness of the p-type semiconductor layer defined in the lamination direction.

17. The SOA of claim 1, wherein:
the III-V semiconductor structure comprises a ridge waveguide having a ridge extending in the longitudinal direction.

18. A method of forming a semiconductor optical amplifier (SOA), the method comprising:
forming a III-V semiconductor structure by sequentially depositing an n-type semiconductor layer, an intrinsic semiconductor layer, and a p-type semiconductor layer to form a p-i-n junction stacked in a lamination direction,
forming a silicon structure comprising a silicon waveguide, the silicon waveguide comprising a central silicon rib extending in a longitudinal direction between two trenches, each trench having a width defined in a lateral direction of at least 3.5 μm; and
integrating the III-V semiconductor structure above the silicon structure in the lamination direction by heterogeneous bonding such that:
the silicon waveguide is under the III-V semiconductor structure;

the silicon waveguide is optically coupled to the III-V semiconductor structure by two waveguide transition couplers defined by the central silicon rib, the two waveguide transition couplers being displaced from each other in the longitudinal direction; and the III-V semiconductor structure defines a high optical gain region, in between the two waveguide transition couplers with respect to the longitudinal direction.

19. A photonic integrated circuit (PIC) comprising a semiconductor optical amplifier (SOA), the SOA comprising:

a III-V semiconductor structure comprising a p-type semiconductor layer, an intrinsic semiconductor layer, and an n-type semiconductor layer stacked in a lamination direction to form a p-i-n junction, the III-V semiconductor structure having:

a first portion having a first width defined in a lateral direction orthogonal to the lamination direction; and a second portion, offset from the first portion in a longitudinal direction orthogonal to the lamination direction and the lateral direction, the second portion having a second width as defined in the lateral direction that is wider than the first width; and a silicon structure positioned below the III-V semiconductor structure in the lamination direction, the silicon structure comprising a silicon waveguide optically coupled to the III-V semiconductor structure, the silicon waveguide comprising a central silicon rib extending in the longitudinal direction under the III-V semiconductor structure laterally between two trenches, each trench having a width in the lateral direction of at least 3.5 μm, the central silicon rib comprising:

a first tapered portion located under the first portion of the III-V semiconductor structure, the first tapered portion increasing in width defined in the lateral direction as the first tapered portion extends in the longitudinal direction; and a second tapered portion located under the second portion of the III-V semiconductor structure, the second tapered portion decreasing in width defined in the lateral direction as the second tapered portion extends in the longitudinal direction, the silicon structure and the III-V semiconductor structure being heterogeneously integrated into the PIC.

20. The PIC of claim 19, wherein:

the silicon structure further comprises two supporting silicon ribs extending parallel to at least a portion of the central silicon rib, each supporting silicon rib being laterally separated from the central silicon rib within a respective trench such that the supporting silicon rib defines within the trench an inner trench proximal to the central silicon rib and an outer trench distal from the central silicon rib.

* * * * *